(12) United States Patent
Gidon

(10) Patent No.: US 9,793,308 B2
(45) Date of Patent: Oct. 17, 2017

(54) IMAGER INTEGRATED CIRCUIT AND STEREOSCOPIC IMAGE CAPTURE DEVICE

(75) Inventor: Pierre Gidon, Echirolles (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 555 days.

(21) Appl. No.: 13/432,483

(22) Filed: Mar. 28, 2012

(65) Prior Publication Data

US 2012/0268574 A1    Oct. 25, 2012

(30) Foreign Application Priority Data

Apr. 22, 2011   (FR) ...................................... 11 53512

(51) Int. Cl.
*H04N 13/02* (2006.01)
*H01L 27/146* (2006.01)
(Continued)

(52) U.S. Cl.
CPC ....... *H01L 27/14625* (2013.01); *H04N 3/155* (2013.01); *H04N 5/2254* (2013.01); *H04N 7/18* (2013.01); *H04N 9/097* (2013.01); *H04N 13/021* (2013.01); *H04N 13/0214* (2013.01); *H04N 13/0217* (2013.01); *H04N 13/0225* (2013.01);
(Continued)

(58) Field of Classification Search
CPC ........ H04N 3/155; H04N 5/2254; H04N 7/18; H04N 9/097; H04N 13/021; G02B 6/06; G02B 27/2214; H01L 27/14627; G01J 5/20
USPC ............ 257/432; 348/49, 61, 308, 336, 340; 359/67, 462, 619; 250/227.2, 338.1; 345/419, 15, 690
See application file for complete search history.

(56) References Cited

U.S. PATENT DOCUMENTS 5,039,204 A * 8/1991 Choi ............................ 349/106
5,828,487 A   10/1998 Greening et al.
(Continued)

FOREIGN PATENT DOCUMENTS

WO   WO 00/50927     8/2000
WO   WO 02/078324 A2  10/2002

OTHER PUBLICATIONS

U.S. Appl. No. 13/443,474, filed Apr. 10, 2012, Gidon.
(Continued)

*Primary Examiner* — Jorge L Ortiz Criado
*Assistant Examiner* — Daniel Chang
(74) *Attorney, Agent, or Firm* — Oblon, McClelland, Maier & Neustadt, L.L.P.

(57) ABSTRACT

An imager integrated circuit intended to cooperate with an optical system configured to direct light rays from a scene to an inlet face of the circuit, the circuit being configured to perform a simultaneous stereoscopic capture of N images corresponding to N distinct views of the scene, each of the N images corresponding to light rays directed by a portion of the optical system which is different from those directing the rays corresponding to the N−1 other images, including:
  N subsets of pixels made on a same substrate, each of the N subsets of pixels being intended to perform the capture of one of the N associated images,
  means interposed between each of the N subsets of pixels and the inlet face of the circuit, and configured to pass the rays corresponding to the image associated with said subset of pixels and block the other rays.

17 Claims, 7 Drawing Sheets

(51) Int. Cl.
*H04N 5/225* (2006.01)
*H04N 7/18* (2006.01)
*H04N 9/097* (2006.01)
*H04N 3/14* (2006.01)
*G01J 5/20* (2006.01)
*G02B 6/06* (2006.01)
*G02B 27/22* (2006.01)

(52) U.S. Cl.
CPC ............ H04N 13/0282 (2013.01); *G01J 5/20* (2013.01); *G02B 6/06* (2013.01); *G02B 27/2214* (2013.01); *H01L 27/14627* (2013.01)

(56) References Cited

U.S. PATENT DOCUMENTS

| | | | |
|---|---|---|---|
| 6,396,873 | B1 | 5/2002 | Goldstein et al. |
| 2002/0054208 | A1 | 5/2002 | Goldstein et al. |
| 2002/0140835 | A1 | 10/2002 | Silverstein |
| 2003/0209668 | A1* | 11/2003 | Tohyama .................. 250/338.1 |
| 2005/0078368 | A1* | 4/2005 | Racette et al. ............... 359/462 |
| 2007/0058258 | A1* | 3/2007 | Mather et al. ............... 359/619 |
| 2007/0188601 | A1 | 8/2007 | Rohaly et al. |
| 2008/0204900 | A1 | 8/2008 | Rohaly et al. |
| 2009/0219432 | A1* | 9/2009 | Palum et al. ................ 348/340 |
| 2009/0303366 | A1* | 12/2009 | Gambino et al. ............ 348/308 |
| 2010/0265384 | A1* | 10/2010 | Tay et al. ..................... 348/336 |
| 2010/0289885 | A1* | 11/2010 | Lu et al. ......................... 348/61 |
| 2011/0241145 | A1* | 10/2011 | Lenchenkov ................. 257/432 |
| 2012/0187282 | A1* | 7/2012 | Wang et al. ............... 250/227.2 |

OTHER PUBLICATIONS

Search Report dated Jun. 19, 2012 in European Application No. 12161244.4 (With English Translation of Category of Cited Documents).

Preliminary Search Report dated Dec. 20, 2011 in French Application No. 1153512 (With English Translation of Category of Cited Documents).

David D. Donaldson, et al., "Simultaneous stereoscopic fundus camera incorporating a single optical axis", Invest. Ophtamol. Vis. Sci., Mar. 1980, pp. 289-297.

"Sony Develops High Frame Rate Single Lens 3D Camera Technology—Captures natural and smooth, high quality 3D images at 240fps-" HFR, URL: [http://www.sony.net/SonyInfo/News/Press/200910/09-117E], Oct. 1, 2009, 3 pages.

"Vivitar Qdos 3-Dimensional Lens System", URL: [http://www.stereofotos.de/3D-Anaglyphen/Vivitar_Qdos_System/body_vivitar_qdos_system.html], Retrieved from the internet on Jul. 2, 2012, 9 pages (With English Translation).

* cited by examiner

# IMAGER INTEGRATED CIRCUIT AND STEREOSCOPIC IMAGE CAPTURE DEVICE

TECHNICAL FIELD

The invention relates to the field of fixed or moving stereoscopic image capture, with at least two views.

The invention is in particular applicable to the fields of endoscopy, microscopy, photography, video cameras (cinema, industrial control, . . . ).

STATE OF PRIOR ART

In the fields of photography and video, the stereoscopy, that is a reproduction of a moving or fixed image, in relief from at least two conventional images, that is "planar", without relief, is generally performed by two (or more) image capture devices, such as cameras or video cameras, directed towards the same scene and enabling images to be captured in this same scene at different points of view.

Several constraints should be met by these devices:

the images of a same scene which are captured at different points of view should be captured simultaneously;

the capture devices should be identical, within the technological dispersion;

the stereoscopic base should be adapted to the observed subject (the stereoscopic base corresponds to the position deviation between each pair of points of view);

it is necessary to be able to drive most of the device settings simultaneously;

the device settings should be similar: equality between exposure times, equality between sharpness positions, equality between optics diaphragms, etc.

Approximations are necessarily performed on these constraints, consequently the resulting stereoscopic images generally suffer from these approximations. In order to reduce these approximations, different solutions have been proposed.

It is for example known to create stereoscopic images from a single optics.

The image is formed on a single imager integrated circuit, or image sensor, which enables the constraints related to the equality between settings and properties between different capture devices to be suppressed.

Document U.S. Pat. No. 5,828,487 describes in particular a stereoscopic image capture device including a shutter provided between the lens system of the device and the image sensor, enabling a right side and a left side of the optical path to be alternately shuttered and thus, two images of a same scene but each having a different perspective to be consecutively captured (right and left images). This non-simultaneity of the captured images however gives rise to a problem when an element of this scene is rapidly moving because in this case, the stereoscopy is lost, since the object is in two different positions on the right and left images of a same stereoscopic image.

It is also known to make a stereoscopic image capture device comprising two optical systems provided side by side and forming two images side by side on a same imager integrated circuit. The constraints are in this case very strong on the optical system. Such a device also implies providing a partition wall between the 2 halves of the sensor, in order to artificially form two sensors side by side. Furthermore, in comparison with the initial field angle of the sensor, that is the field angle of the sensor during a non-stereoscopic image capture, the field angle of the stereoscopic image sensor is in this case reduced by half.

It is also known to make a stereoscopic image capture device including a lens system coupled to an additional optical system comprising mirrors enabling the light rays of a same scene to be directed onto two distant imager integrated circuits. The drawback of such a device is a desynchronization in the captured images and differences in sensitivity between both sensors are possible because such both sensors are obtained from two independent electronics. Furthermore, the additional optical system comprised of mirrors is complex and costly to be made.

DESCRIPTION OF THE INVENTION

Thus there is a need to provide an imager integrated circuit enabling a stereoscopic image capture to be performed getting rid of the constraints that should be met by devices of prior art, which can be used with any optical system, and in particular a single optical system such as a conventional optical system for capturing non-stereoscopic images, the field angle of which is not reduced compared to a non-stereoscopic image sensor, and not giving rise to a problem of synchronism or simultaneity of image capture.

To do this, one embodiment provides an imager integrated circuit, also called image sensor, intended to cooperate with an optical system configured to direct light rays from a scene to an inlet face of the imager integrated circuit, said imager integrated circuit being configured to perform a simultaneous stereoscopic capture of N images corresponding to N distinct views of the scene, N being an integer higher than 1, each of the N images corresponding to light rays directed by a portion of the optical system which is different from those directing the light rays corresponding to the N−1 other images, the imager integrated circuit including:

N subsets of pixels made on a same substrate, each of the N subsets of pixels being intended to perform the capture of one of the N images associated therewith, means interposed between each of the N subsets of pixels and the inlet face of the imager integrated circuit, and configured, or capable, to pass the light rays corresponding to the image associated with said subset of pixels and block the other light rays directed from the optical system to said subset of pixels.

This imager integrated circuit rests on the optical principle according to which all the rays coming from a same object or a same scene, directed by a single optical system and received by the integrated circuit, correspond to several sets of rays forming "views" of the object or scene under different angles. These different views are simultaneously captured by the different subsets of pixels each receiving the light rays of the view associated therewith.

The stereoscopic vision is thus made when the different views are along the direction of the plane of the pixels, corresponding to the direction connecting both eyes of the final observer. Thus, pixels of the different subsets of pixels can be alternately provided along a single axis parallel to the inlet face of the imager integrated circuit (for example one of the axes X or Y when the pixels form a matrix with sides parallel to the axes X and Y). For example, when the imager integrated circuit is configured to perform a simultaneous stereoscopic capture of two images, the pixels belonging to either of both subsets of pixels intended to perform the capture of both images are alternately provided along a single axis parallel to the inlet face of the imager integrated circuit.

However, it is possible that the distribution in the pixels in the different subsets of pixels is performed by alternating the pixels along two axes of the sensor, these axes being parallel to the inlet face of the imager integrated circuit and perpendicular to each other (for example the axes X and Y of a matrix having sides parallel to the axes X and Y). In this configuration, is obtained a higher number of simultaneously captured images by the imager integrated circuit enabling, among other things, a stereoscopic vision to be preserved in spite of a turning over of the image sensor or the direction of observation, by selecting stereoscopic images among all the captured images.

This imager integrated circuit has in particular the advantage to be usable with a conventional image capture optical system, whether stereoscopic or not, such as a camera objective lens or a double periscope, and in particular with an optical system the outlet element of which directing the light rays on the entire imager integrated circuit is a single lens. All the captured images come from a single optical system. This imager integrated circuit is compatible with numerous optical systems such as simple lenses or objective lenses, periscopic optics or even catadioptric systems.

The synchronism of the capture of different images is provided due to the use of a single sensor for the stereoscopic capture. Thus, even if advantages of a long exposure by the rolling reading of pixels ("rolling shutter" mode) are desired to be enjoyed, since the pixels capturing the two (or more) images are neighbourings, they can be simultaneously read while reading a line of the sensor.

Even if the pixels are not simultaneously read, but one after the other, the stereoscopic image is still captured with the minimum time possible, and this for a maximum synchronism.

Furthermore, in comparison with a non-stereoscopic imager integrated circuit having the same dimensions as this imager integrated circuit, including the same number of pixels analogously provided but not including means for stereoscopically capturing images, the field of view of the optical system—imager integrated circuit couple is not changed.

The stereoscopic base is selected through construction, and is not restricted by the sensor. It is the optics that determines this stereoscopic base.

In the field depth area of the optics, the parallax information is more accurate than the minimum fuzzy of the image (Airy's pattern).

Furthermore, a conventional problem in stereoscopy and known as "stereoscopic window violation" is easier to solve by an a posteriori cropping of the different captured images. This problem relates to the relief image of the edges of N images. Indeed, these edges are seen as a planar frame in the final image. But, the final image is seen in relief, that is as a volume. Foregrounds of this volume can be located ahead of the planar frame. The problem is that this frame often positioned behind then masks a foreground, which makes the image incomprehensible because it is an inexistent state in the real world. The default frame of images captured by the imager integrated circuit is located about a plane with a maximum sharpness. Therefore, the foregrounds are generally located ahead of the plane with a maximum sharpness. An advantageous solution to this problem enabling the position of the frame to be moved (advanced) in the relief image can thus consist in a posteriori cropping the N images (after the capture thereof). Another solution could consist, in the case of two captured images, in masking by constructing pixels of a first edge of the image for one of the images and masking the pixels of a second opposite edge of the image for the other image.

The imager integrated circuit can be made in CMOS technology as well as in CCD technology.

Even though the imager integrated circuit is herein described for the field of wavelengths of the visible region, it is applicable to ultraviolet and/or infrared regions.

Said means may thus include:

at least two opaque layers superimposed one above the other, provided between the pixels and the inlet face of the imager integrated circuit, both opaque layers having, passing therethrough, a plurality of holes forming, towards each pixel, at least one pair of superimposed diaphragms capable of passing a part of the light rays corresponding to the image associated with the subset of pixels of which said pixel is part and which are capable of blocking other light rays directed from the optical system to the said pixels and corresponding to the other images, and/or at least two levels of colour filters superimposed one above each other, arranged between the pixels and the inlet face of the imager integrated circuit and forming, towards each pixel, at least one first pair of superimposed colour filters configured to pass a part of the light rays corresponding to the image associated with the subset of pixels of which said pixel is part and at least one second pair of superimposed colour filters configured to block the other light rays directed from the optical system to said pixel and corresponding to the other images.

In comparison with a stereoscopic image sensor resorting to microlenses to direct light rays to the suitable pixels, performing and controlling the characteristics of said means set out above is easier than for microlenses the shape of which should be very accurately controlled. Moreover, the thickness of the microlenses also induces a refraction effect. The correction of this refraction effect thus demands a control of the pitch and curvature of the lenses, whereas for colour filters or opaque layers, only the position of apertures should be controlled.

Furthermore, the use of lenses each covering 4 pixels requires a complex stereoscopic reconstruction from 4 images.

In a first embodiment, said means may include at least two opaque layers superimposed above each other, provided between the pixels and the inlet face of the imager integrated circuit, both opaque layers having, passing therethrough, a plurality of holes forming, towards each pixel, at least one pair of superimposed diaphragms capable of passing a part of the light rays corresponding to the image associated with the subset of pixels of which said pixel is part and which are capable of blocking other light rays directed from the optical system to said pixels and corresponding to the other images.

In a first alternative, the number of holes passing through each of both opaque layers may be equal to the total number of pixels of the N subsets of pixels.

When N=2 and said portion of the optical system corresponds to half the optical system (that is m=2), a distance H between the pixels and a second one of both opaque layers, a first one of both opaque layers being provided between the pixels and the second one of both opaque layers, may be such that $H \leq 1.5 \times p \cdot O \cdot n$, with:

p: pitch of the pixels;

O: numerical aperture of the optical system;

n: optical index of a transparent material provided between both opaque layers.

In a second alternative, the number of holes passing through a first one of both opaque layers may be equal to the total number of pixels of the N subsets of pixels and the number of holes passing through a second one of both opaque layers may be equal to $(M_{pix}/N) \pm 1$, with $M_{pix}$ corresponding to said total number of pixels, said first one of both opaque layers being provided between the pixels and the second one of both opaque layers.

A distance H between the pixels and the second one of both opaque layers may be such that $$H = \frac{n \cdot m \cdot O \cdot (N-1) \cdot p}{(m-1) + (m/D) \cdot (N-1) \cdot p},$$

with:
D: diameter of the optical system;
D/m: diameter of one of said portions of the optical system;
p: pitch of the pixels;
O: numerical aperture of the optical system;
n: optical index of a transparent material provided between both opaque layers.

In this case, when N=m and the diameter of the optical system is very high as compared to the pitch of pixels, a distance H between the pixels and the second one of both opaque layers may be such that H=N·p·O·n.

At least one of the opaque layers may be formed by electric interconnection lines electrically connected to the pixels. Such a configuration has in particular the advantage of using electric interconnection layers, present in all the imager integrated circuits, and therefore does not require making further opaque layers. Furthermore, the use of electric interconnections to form said means enables further elements shuttering light not to be added, which enables the quantity of light arriving on the inlet face of the imager integrated circuit not to be reduced.

The pixels may be provided between the inlet face of the imager integrated circuit and electric interconnection lines electrically connected to the pixels. The imager integrated circuit is in this case a "Back-side" type.

The holes formed in the opaque layers may form trenches aligned side by side. The holes may be provided in staggered rows, and thus form a "draughtboard". Such a staggered arrangement enables the moiré effects to be reduced on the captured images. Such a staggered arrangement would be hardly possible with cylindrical microlenses because of the difficulty of making a plane at the ends of the linear direction of the cylindrical microlenses, for example aligned above columns of pixels.

Each pixel may include non-photosensitive electric and/or electronic elements masked by the opaque layers. This configuration is advantageous because areas which are unreachable by light rays are used, to provide therein elements not forming the photosensitive elements of the pixels.

Both opaque layers may be spaced apart from each other by air and/or $SiO_2$ and/or a resin (or another material) which is optically transparent to the light rays intended to be captured by the pixels.

Both opaque layers may be composed of metal and/or resin and/or covered with at least one antireflection layer.

In a second embodiment, said means may include at least two levels of colour filters superimposed above each other, provided between the pixels and the inlet face of the imager integrated circuit, and may form, towards each pixel, at least one first pair of superimposed colour filters configured to pass part of the light rays corresponding to the image associated with the subset of pixels of which said pixel is part and at least one second pair of superimposed colour filters configured to block the other light rays directed from the optical system to said pixel and corresponding to the other images. This embodiment advantageously uses the colour filters present in a colour image sensor to make the means for capturing stereoscopic images, in particular for "back-side" image sensors wherein the light rays do not pass through the metal interconnection lines of the sensor. Once again, no further shuttering element which would reduce the quantity of light captured by the imager integrated circuit is added.

At least one of both levels of colour filters may also include portions of opaque material configured to block, towards each pixel, part of said other light rays directed from the optical system to said pixel and corresponding to the other images.

Both levels of colour filters may be spaced apart from each other by air and/or $SiO_2$ and a resin (or another material) optically transparent to the light rays intended to be captured by the pixels.

The pixels may be configured to capture images in the visible and/or infrared regions.

Another embodiment also relates to a stereoscopic image capture device including at least one imager integrated circuit such as described above and at least one optical system configured to direct the light rays from a scene to the imager integrated circuit.

The pixels of the imager integrated circuit may be configured to capture images in the infrared region, wherein said device may be a bolometer.

BRIEF DESCRIPTION OF THE DRAWINGS

The present invention will be better understood upon reading the description of exemplary embodiments only given by way of illustration and in no way limiting by reference to the appended drawings wherein.

Identical, similar or equivalent parts of the different figures described herein below have the same reference numerals so as to facilitate switching from one figure to another.

The different parts represented in the figures are not necessarily drawn to a uniform scale, for a better understanding of the figures.

The different possibilities (alternatives and embodiments) should be understood as being not mutually exclusive and can be combined with each other.

DETAILED DESCRIPTION OF PARTICULAR EMBODIMENTS

Figure 1:
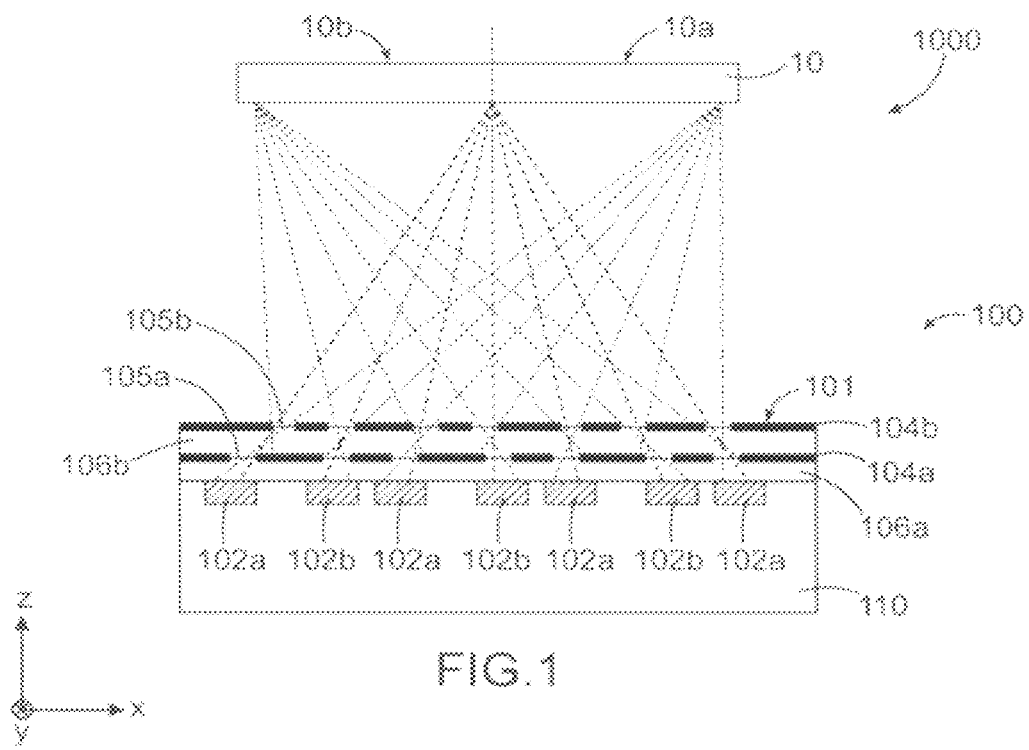
FIGS. 1 to 4 represent an image capture device including an imager integrated circuit according to different alternatives of a first embodiment.

FIG. 1 will be first referred to, which represents an image capture device 1000 including an imager integrated circuit, or image sensor, 100 according to a first embodiment.

In this first embodiment, the device 1000 enables stereoscopic image capture to be performed with two images, or two views, and corresponds for example to a camera or video camera. The device 1000 also includes other elements, and in particular an optical system 10 comprising at least one or several lenses and corresponding for example to a fixed focal objective lens.

The imager integrated circuit 100, called hereinafter image sensor, includes a plurality of pixels 102 each including at least one photodetector, for example a photodiode or any other equivalent means for transforming received optical information (amount of photons) into an electric signal. The light rays directed by the optical system 10 and arriving onto the image sensor 100 at an inlet face 101 correspond to the images intended to be captured by the image sensor 100. A first subset of pixels referenced 102a is intended to capture a first part of the light rays directed to the image sensor 100. A second subset of pixels referenced 102b is intended to capture a second part of the light rays directed to the image sensor 100. In the example of FIG. 1, the pixels 102a and 102b are alternately provided side by side parallel to the axis x. In this example, this alternation of pixels belonging to either subset of pixels is only made along the axis x (and not along the axis y).

In order to select the rays that should be captured by either subset of pixels 102a, 102b, the image sensor 100 is provided with a mask formed by two opaque layers 104a, 104b, that is non-transparent towards light rays received by the image sensor 100, superimposed and interposed between the pixels 102 and the optical system 10. These opaque layers 104a, 104b are for example composed of metal. Each of the opaque layers 104a, 104b includes several apertures 105a, 105b or holes such that, for each pixel, each opaque layer forms a diaphragm. Thus, for each pixel, one of the apertures 105a formed in the layer 104a forms a lower diaphragm on which is superimposed an upper diaphragm formed by one of the apertures 105b made in the layer 104b.

In the example represented in FIG. 1, each of the layers 104a, 104b includes a number of apertures 105a, 105b corresponding to the total number of pixels 102a, 102b of the image sensor 100. In the example described herein where the image sensor 100 is intended to perform stereoscopic image capture with two images or two views, the photodetectors or the pixels 102a only receive the light rays from the right half (referenced 10a in FIG. 1) of the optical system 10, the photodetectors 102b only receiving the rays from the left half (referenced 10b in FIG. 1) of the optical system 10. The rays from the middle of the optical system 10 are received by all the pixels 102a and 102b.

The rays from the right half 10a of the optical system 10 do not reach the pixels 102b because they are blocked by either or both opaque layers 104a, 104b. Moreover, the light rays from the left half 10b of the optical system 10 do not reach the pixels 102a because they are blocked by either or both opaque layers 104a, 104b.

A first image is thus obtained from the signals delivered by the pixels 102a and a second image is obtained from the signals delivered by the pixels 102b. The light rays directed by one of the halves 10a, 10b of the optics 10 arrive in one of two pixels of the image sensor 100 whereas those from the other half are stopped by the diaphragms for these same pixels, but reach the other pixels, inaccessible to the rays of the first half because of the presence of the diaphragms.

The optical indexes of the materials used are selected such that the refraction in the materials has a very low impact on the size and position of the apertures 105a, 105b formed in the opaque layers 104a, 104b.

The pixels 102 of the image sensor 100 can be spaced apart from each other by a pitch which is regular or not. The maximization of the number of pixels in an image sensor is generally obtained by spacing the pixels by a regular pitch, the dark area between two photodetectors being equal to the width of a photodetector in the case of a stereoscopic capture with two images. For each pixel, the elements other than the photodetector (interconnection lines, transistors, . . . ) are advantageously provided facing opaque parts of the layers 104a, 104b.

In the example of FIG. 1, the first opaque layer 104a is provided on a first transparent layer 106a, for example composed of a dielectric material, covering the photodetectors 102. Moreover, the second opaque layer 104b is provided on a second transparent layer 106b, for example composed of a dielectric material, covering the first opaque layer 104a.

The opaque layers 104a, 104b are relatively close to the pixels 102. In the image sensor 100, the opaque layers 104a and 104b include a same number of holes 105a, 105b. Moreover, the diameter of the optics is much higher than the pitch between two pixels. For the image sensor 100, the distance H between the opaque layer 104b, forming the upper diaphragms, and the pixels 102 can be lower than or equal to about $1.5 \times p \cdot O \cdot n$, with:

p: pitch between two pixels;
N: number of captured views (here N=m=2);
O: numerical aperture of the optics 10 (equal to the ratio of the focal lens F to the diameter D);
n: optical index of the transparent material of the layers 106a, 106b.

Figure 2:
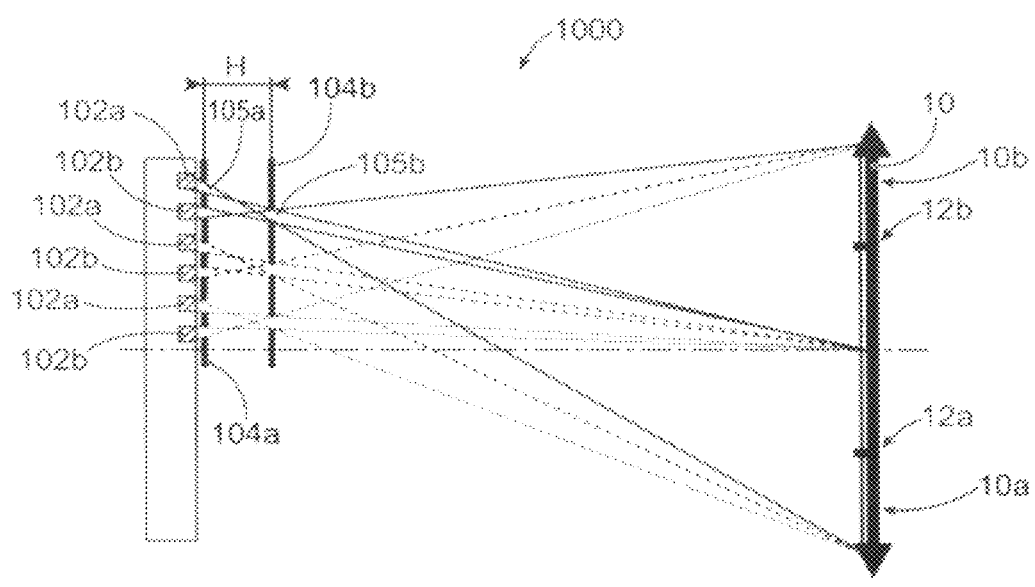

In an advantageous alternative, the second opaque layer 104b forming the upper diaphragms can be provided at a particular distance from the pixels 102, this distance being approximately equal to $2 \cdot p \cdot O \cdot n$ when the pitch of the pixels is very small as compared to the diameter D of the optics 10, N=2 and the surface of the material in the apertures of the diaphragms is planar. In this case, the number of apertures formed in the second opaque layer 104b, forming the upper diaphragms, is equal to half the number of pixels, more or less one. Such an example is represented in FIG. 2. It can be seen in this figure that the apertures 105b formed in the second opaque layer 104b pass rays that can come from either half 10a, 10b of the optics 10. The distance between the first opaque layer 104a and the pixels 102 is lower than about $1.5 \times p \cdot O \cdot n$. As represented in FIG. 2, for each pair of pixels, a single aperture 105b formed in the second opaque layer 104b forms an upper diaphragm common to this pair of pixels. Moreover, the sizes of the apertures 105b formed in the second opaque layer 104b are very close to the size of one of the photodetectors.

Generally, the closer the first opaque layer 104a is to the pixels 102, the more the apertures 105a formed in this first opaque layer 104a have high dimensions and close to the size of the photodetectors of the pixels 102.

In the configuration represented in FIG. 2, the light rays from the first right half 10a of the optics 10 and passing through the apertures 105b formed in the upper opaque layer 104b arrive onto the pixels 102a and those from the other left half 10b of the optics 100 passing through the same apertures 105b formed in the upper opaque layer 104b arrive onto the pixels 102b. Any other ray, that is the rays from the right half 10a of the optics 10 and which are directed to the pixels 102b as well as the rays from the left half 10b of the optics 10 and which are directed to the pixels 102a, is blocked by either or both diaphragms formed by the opaque layers 104a, 104b.

Since the pixels 102 only receive the rays from either half of the optics 10, the pixels 102a perform an integration on the light from the half 10a of the optics 10 and the pixels 102b perform an integration of the light from the half 10b of the optics 10.

Thus, unlike an image captured by a conventional sensor the average point of view of which corresponds to the centre of the optics, the image captured by the pixels 102a corresponds to an image the average point of view 12a of which is located approximately in the middle of the right half 10a of the optics 10, and the image captured by the pixels 102b corresponds to an image the average point of view 12b of which is located approximately in the middle of the left half 10b of the optics 10.

In view of the mask formed by the opaque layers 104a, 104b above the pixels 102, about one quarter of the rays from the optics 10 reaches at least one of the pixels 102, which enables two really distinct images obtained by capturing rays from the entire surface of the optics with two most spaced apart possible points of views (the spacing is substantially equal to half the width of the optics). The lit width of each pixel 102 is substantially equal to the width darkened by the mask in the plane of the pixels 102.

In an advantageous alternative embodiment, and when the imager integrated circuit 100 is a "front-side" (light rays entering the front face of the image sensor) type sensor, the opaque layers 104a, 104b of the mask can be formed by the electric interconnection lines, generally composed of metal, forming electric connections between electric/electronic elements of the image sensor. The pattern of these electric lines therefore meets both that imposed to obtain the desired electric wiring in the sensor as well as that imposed to form the diaphragms.

Figure 3:
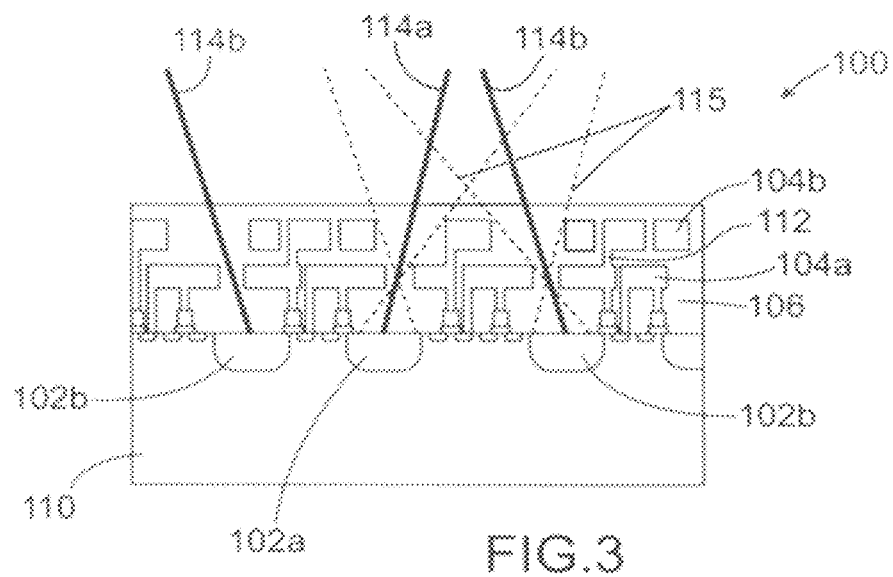

Part of the imager integrated circuit 100 made according to this alternative embodiment is represented in FIG. 3. The pixels 102, here of the CMOS type, are made in a semiconducting substrate 110 and are capable of performing an absorption of the received light rays and a separation of the generated electric charges. The substrate 110 (and therefore the pixels 102) is covered with a dielectric layer 106 (corresponding to the previously described dielectric layers 106a, 106b) wherein are made the electric interconnection layers 104a, 104b also forming the mask enabling the light rays arriving onto the pixels 102 to be selected. The electrically conducting portions forming the opaque layers 104a, 104b can be electrically connected to each other and/or to the photodetectors 102 by vertical conducting vias 112. Lines of sight 114 of the pixels are also represented in this FIG. 3.

Indeed, for each pixel, the upper diaphragm combined with the lower diaphragm formed facing this pixel form together an aperture directed along an axis and enable the light rays intended to be received by the pixel to be selected. In the example of FIG. 3, both pixels 102b having lines of sight 114b directed to the left are intended to receive the rays from the left half of the optical system (not represented), whereas the pixel 102a the line of sight 114a of which is directed to the right is intended to receive the rays from the right half of the optical system. Besides the orientation of the apertures, they also are defined by an acceptance angle, the line of sight forming a bisectrix of this angle. This angle forms a cone limits 115 of which correspond to the boundary between the rays received by the pixel 102 and those intended to be blocked by the diaphragms.

The interconnection layers 104a, 104b also enable the light rays to prevent the CMOS transistors from being lit as well as other elements of the pixels not forming the photosensitive areas. Although not represented, the image sensor 100 includes other elements such as microlenses and colour filters formed above the electric interconnection layers 104 and the dielectric layer 106, the microlenses enabling the refraction to be reduced and light between the metal tracks to be more concentrated. In this alternative, with respect to a non-stereoscopic standard image sensor, the optical axis, or line of sight, of diaphragms formed by the metal tracks is turned over and is not perpendicular to the face of the substrate 110 on which the pixels are formed. The microlenses can also be used to correct the optical aberrations and/or to minimize the optical reflections in the sensor.

Figure 4:
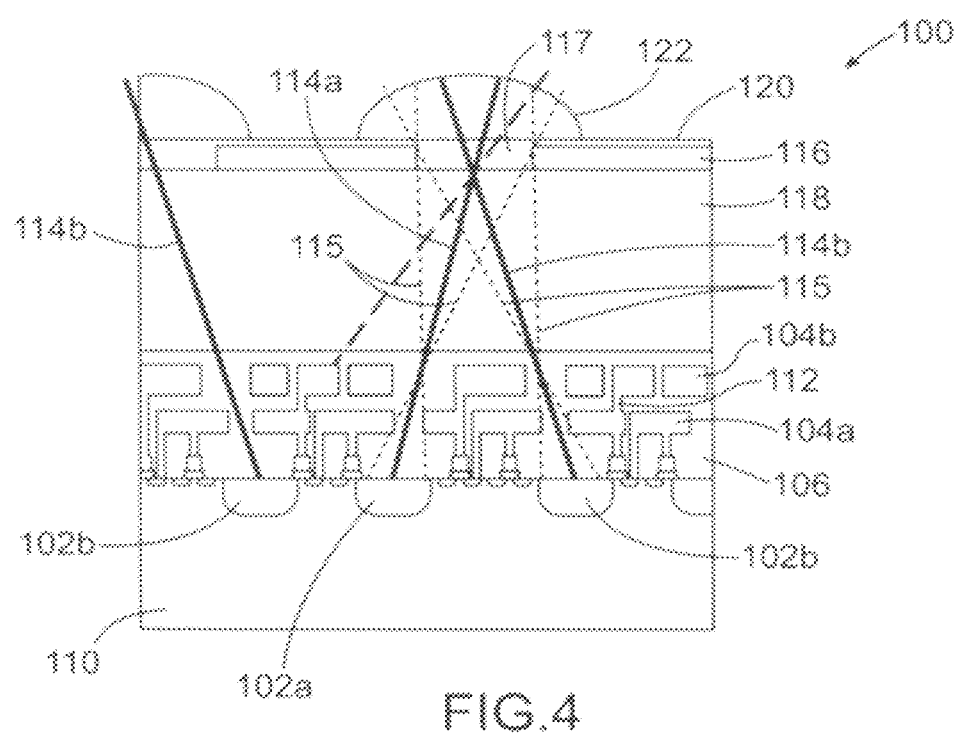

If the thickness of the interconnection layers (thickness of the layers themselves+space between these layers) is insufficient to form the mask for selecting the rays intended to be received by the pixels, it is possible to add, above the interconnection levels, a further opaque layer intended to form the upper diaphragms. Such a configuration is represented in FIG. 4. In this configuration, the interconnection layers 104a and 104b form together the lower diaphragms of the pixels, the upper diaphragm being made by a further layer 116, also composed of an opaque material and wherein apertures 117 are formed. Furthermore, as in the example of FIG. 2, the further layer 116 is provided at a particular distance from the photodetectors 102, this distance being approximately equal to $2 \cdot p \cdot O \cdot n$. Thus, the apertures formed in the layer 116 forming the upper diaphragms pass rays that can come from either half 10a, 10b of the optics 10. The rays intended to be received by two neighbouring pixels pass through a same aperture formed in the layer 116.

The opaque layer 116 is provided on a transparent support 118 covering the dielectric material 106 wherein the interconnection layers 104a, 104b are made. The layer 116 is covered with a passivation layer 120 on which lenses 122 are provided.

In the above described examples, the image sensor 100 can be a colour sensor. In this case, the sensor 100 includes mosaically provided colour filters, under the microlenses, forming for example a Bayer filter. When two neighbouring pixels are intended to form two images, or views, distinct from a same stereoscopic image, each coloured filter will be able to filter the rays intended to be captured by these two neighbouring pixels.

In all the exemplary embodiments described, the photodetectors can be wider than the diffraction pattern, making the diffraction effect almost negligible.

The stereoscopy is obtained from one or more images taken at different points of view along a direction in space. Generally, the mask forming the diaphragms can thus include either apertures forming long lines covering all the pixels aligned along a direction perpendicular to the direction of alignment of the points of view of the different images, or apertures, for example having rectangular shapes, forming a "draughtboard", to align or on the contrary provide in a staggered row the pixels of different images.

Only the electronics performing the resulting information sorting to reconstitute images is adapted according to the arrangements of apertures and maskings, in order to use and process the signals delivered by pixels to reconstitute different views and construct stereoscopic images.

When the image sensor includes colour filters, it is possible to make these filters so that they also form the mask enabling the rays intended to be received by the pixels to be selected. Such a configuration will be particularly interesting in the case of a "backside" sensor, that is a sensor intended to receive a light through its back face, and thus wherein the mask cannot be formed by the electric interconnection layers.

Actually, two superimposed colour filters can act as two superimposed diaphragms such as described above because if their spectra have no or little common part (filters having different colours), then no light passes through these two superimposed filters. Thus, depending on whether a light ray directed towards a pixel should pass through two colour filters having the same colour or two colour filters having different colours, the light will reach the pixel or not.

Figure 5:
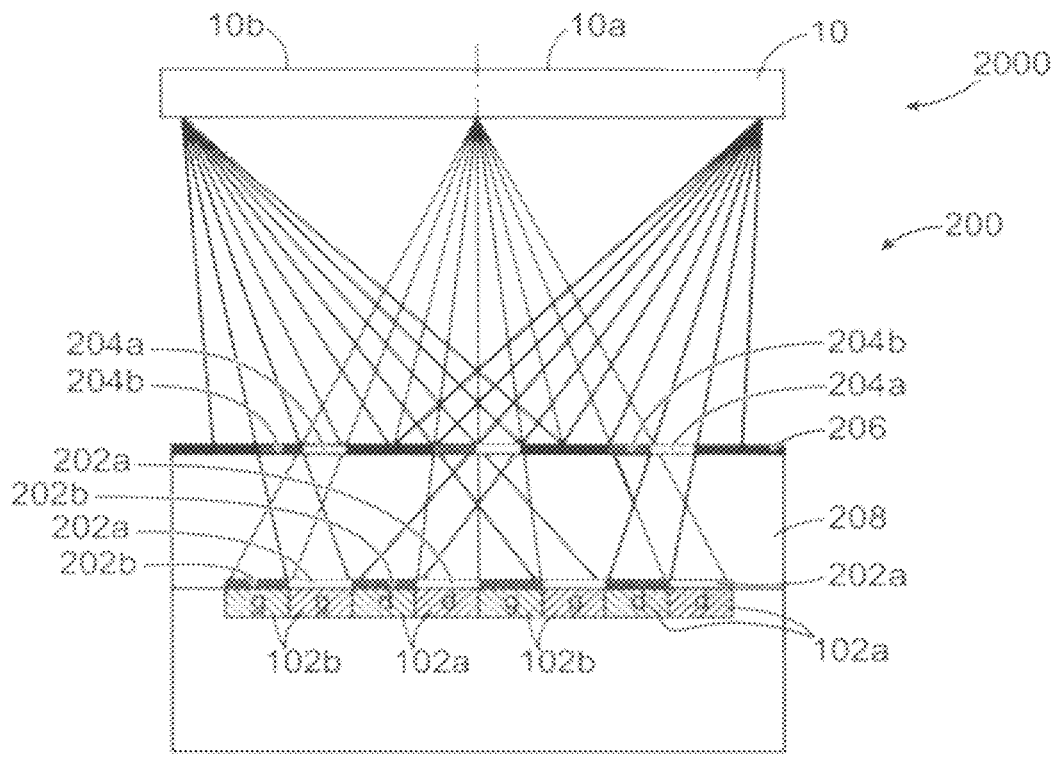
FIG. 5 represents an image capture device including an imager integrated circuit according to a second embodiment.

FIG. 5 represents an image capture device 2000 including an imager integrated circuit, or image sensor 200 according to a second embodiment. In this second embodiment, the device 2000 enables a stereoscopic image capture with two images, or two views, and corresponds for example to a camera or video camera. The device 2000 also includes other elements, and in particular an optical system 10 comprising at least one or more lenses and corresponding for example to a fixed focal objective lens.

The stereoscopic imager integrated circuit 200 uses superimposed colour filters to form the selection mask of light rays received by the pixels 102 of the sensor 200.

Lower colour filters 202 are provided just above the pixels 102. For simplifying reasons, the filters 202 are considered as having two colours, that is red filters 202a and blue filters 202b alternately provided side by side. Upper (red) 204a and (blue) 204b colour filters are provided above the lower colour filters 202. The upper colour filters 204 are made in an opaque layer 206 which enables some light rays to be blocked. The lower colour filters 202 are separated from the upper colour filters 204 by a transparent material.

The distance between the upper colour filters 204 and the pixels can correspond to the distance separating the upper diaphragms and the pixels from the image capture device 1000 previously described. The lower colour filters 202 can be provided against the photodetectors of the pixels 102.

The double colour filtering performed enables the blue or red filtered pixels to be alternately pointed towards the right half or the left half of the optics. Two neighbouring pixels provided under filters having different colours will be herein intended to form the same image. In FIG. 5, the pixels 102b are provided two by two side by side and are intended to receive light rays from the left half 10b of the optical system 10. Moreover, the pixels 102a are provided two by two side by side and are intended to receive the light rays from the right half 10a of the optical system 10.

The lower filters 202 have the same function as the above described lower diaphragms. On the other hand, the upper filters 204 are coupled to opaque parts of the layer 206 in order to fulfil the function of the above described upper diaphragms.

In this second embodiment, each pixel 102 only receives light rays passing through two superimposed filters having similar colours. Thus, the other rays directed towards this pixel but which have on their path two filters having different colours or an opaque part of the layer 206 are blocked before reaching this pixel.

The red and blue colours of the filters 202 and 204 are only given by way of illustration. In order to form, towards a pixel, a pair of colour filters intended to block undesirable light rays, it is possible to use either pair of colour filters, provided that their spectrum does not or sparsely overlap mutually. It is for example possible to use and combine red, green and blue colours of the filters into Bayer matrix to form these superimposed colour filters.

The colour filtering enabling the colour to be determined needs at least three colours which are homogeneously distributed throughout the surface of the sensor. This arrangement of the filters only relates to the direction of the plane wherein the stereoscopic effect is desired, but all the colours should be altered by this arrangement for the right and left views to be then reconstructed through colour dematrixing.

By using the colour filters to form the masks for selecting light rays, these filters thereby fulfil two functions, that is the reproduction of the image colours and the separation of the points of view of the stereoscopic images. In comparison with the first embodiment wherein the selection of light rays reaching the pixels is performed by the opaque layers including apertures, this second embodiment enables a larger quantity of light to be captured because the pixels as well as the photodetectors can herein be adjoining. A better coverage of the sensitive surface of the image sensor can thereby be obtained.

In the example of FIG. 5, the number of upper filters 204 is lower than the number of lower filters 202 (very close to lower by half), because the configuration is analogous to that previously described for FIG. 2 (the upper diaphragms are common to the pixels 102a and 102b).

However, it is possible for the upper filters to be closer to the pixels. In this case, the number of upper filters 204 is equal to the number of lower filters 202.

In another alternative, when the image sensor is the "back-side" type, it is possible that the mask is not formed by colour filters, but by opaque layers as previously described in connection with FIGS. 1 and 2, these layers being in this case made on the back-face side of the sensor.

In view of the very high number of pixels the image sensor can include (for example between about 10 and 20 millions of pixels), a single sensor such as described above can be used to make a stereoscopic image capture with N images, or N views, with N for example between 2 and 40. The sensor can in particular be used to make a stereoscopic image capture with 8 images such as required for the relief TV standard called "Alioscopy".

In the above described examples, the cone of vision of each pixel transfers an average point of view at the inlet of the optical system. In the case of a non-stereoscopic imager integrated circuit not including means enabling light rays received by the pixels to be selected, the average point of view is located on the optical axis, in the middle of the optics, and is the same for all the pixels of the sensor. In the image sensor according to the invention, the points of view of different captured images are differentiated for each subset of pixels and are generally located out of the optical axis of the optical system. The distance between two average points of view corresponds to the stereoscopic base. In the examples previously described, the different optical fields sensed by the pixels are not superimposed (the parts 10a and 10b are not superimposed).

Figure 6:
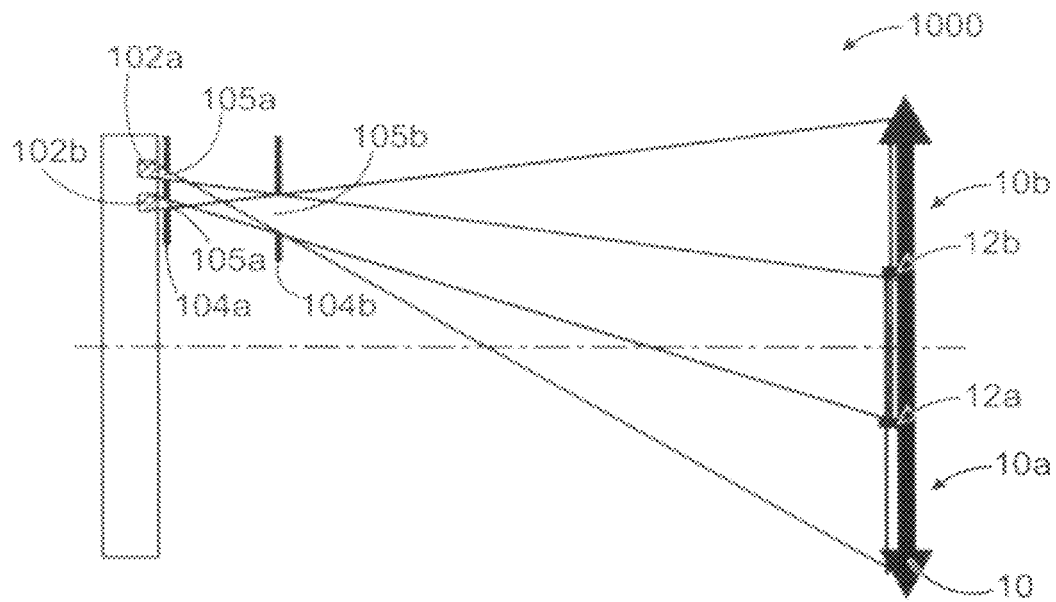
FIGS. 6 to 8 represent different alternative embodiments of an image capture device including an imager integrated circuit.

In an alternative, it is possible for these optical fields to be superimposed, as represented in FIG. 6. The "cones" of vision of the pixels are wider than in the examples of the previous figures.

Thus, in this configuration represented in FIG. 6, the average points of view 12a, 12b are closer to one another and a greater amount of light rays is received by the pixels 102 because light rays are common to the images of different points of view captured by the different subsets of pixels. The different parts 10a, 10b from which the rays are directed towards the image sensor 100 are also superimposed. The stereoscopic base is thereby herein reduced. Upon construction, the force the resulting stereoscopic parallaxes can thus be selected as a function of the assumed photographic subject. The distance between the pixels 102 and the diaphragms formed by the opaque layers 104a, 104b can also be changed.

Figure 7:
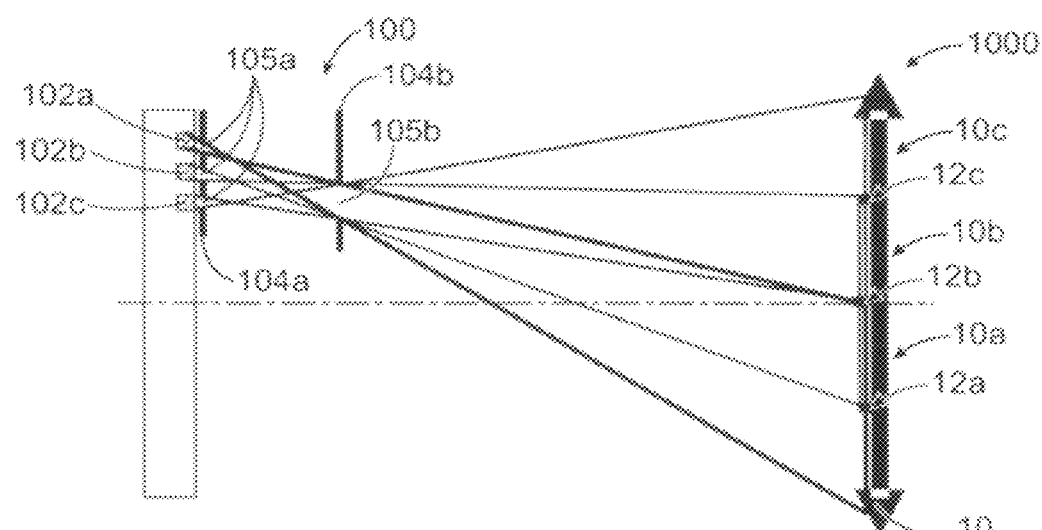
Figure 8:
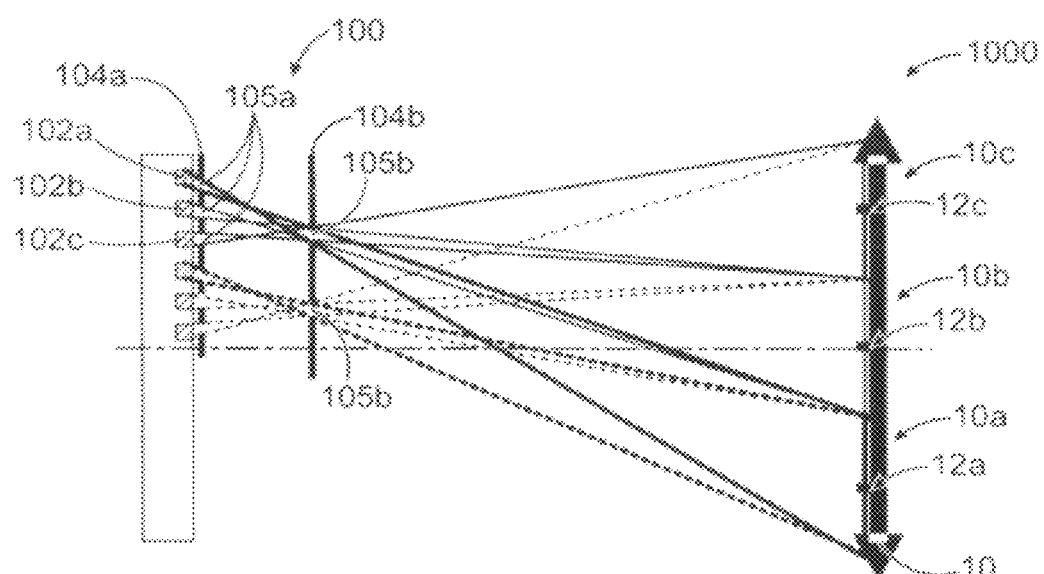

FIGS. 7 and 8 schematically represent alternatives of the stereoscopic image capture device 1000 with three images. Rays from three distinct parts 10a, 10b, 10c of the optical system are captured by three subsets of pixels 102a, 102b, 102c. In the example of FIG. 7, the captured optical fields are superimposed (the parts 10a, 10b and 10c of the optical system 10 are superimposed), whereas in the example of FIG. 8, the captured optical fields are not superimposed.

The greater the number of images simultaneously captured by the capture device, the lesser the amount of light rays, that is the quantity of light, received by each subset of pixels to capture one of the images. Moreover, the greater the number of images simultaneously captured by the capture device, the smaller the stereoscopic base between two neighbouring points of view. However, the stereoscopic base can also be adapted depending on the optical system used.

The focus position of the image capture device according to the invention has not exactly the same effect as for a non-stereoscopic image capture. The system is generally calculated for a sharp image between the infinity and moderately close planes, and this with a fixed optical aperture. It is for example possible to select a fixed focus in hyperfocal position.

When the focus is made on close planes, since the imager integrated circuit moves back with respect to the optical system, the cones defining the points of view are superimposed. Since the diameter of the optics does not change, the points of view are moved closer and the stereoscopic base is reduced.

For a backward movement equal to twice the focal length (that is for an image having a size equal to the object), there is no stereoscopic effect any longer with a sensor intended to operate to the infinity.

Consequently, for macrophotography, the stereoscopic integrated circuit is specially defined for this application and is accordingly restricted in relief depth, in particular for endoscopic applications.

The optical system of the imager integrated circuit according to the invention can include so-called catadioptric mirror objective lenses that can have high diameters. Because the stereoscopic base is only extended in a single direction, the optical system can be constructed with a great dimension in the direction of the stereoscopic base and a small dimension in the direction perpendicular to the stereoscopic base. The optical system could include two (or more) head-to-foot arranged periscopes, conveying the peripheral images in front of the different cones of vision of the image sensor.

It will now be described, in connection with FIG. 9, the calculations enabling the different elements of the image capture device 1000 previously described in connection with FIGS. 2, 6, 7 and 8 to be dimensioned and positioned.

It is considered that the object is to infinity and that the image is sharp, and thus that the plane of the pixels 102 is at the focal length F.

There is then:
D: (back) diameter of the optical system 10;
D/m: width seen by each pixel, corresponding to the optical field or even to the dimension of one of the parts (referenced 10a, 10b or 10c in FIG. 9) of the optical system 10 in the stereoscopic direction;

N: number of images, or views, forming a stereoscopic image (three in the example of FIG. 8; wherein m and N can be different);
H: position of the plane of the upper diaphragms, that is the distance between the upper diaphragms (or upper colour filters) and pixels;
L: width of an aperture of upper diaphragm (corresponding to the dimension of one side or the diameter of one of the holes 105b);
p: pitch of the pixels, that is the distance between two pixels 102 (for example equal to 5 µm, but that can for example range from 1 µm to 50 µm depending on the application);
l: width of a photodetector in a pixel 102;
a: intersecting height of the end rays (rays bounding the cone of vision of the pixels) for each pixel;
b: intersecting height of end rays for the selected number of views (rays bounding the cone of view of N neighbouring pixels);
n: index of the dielectric material separating the opaque layers 104 (or the colour filters).

Figure 9:
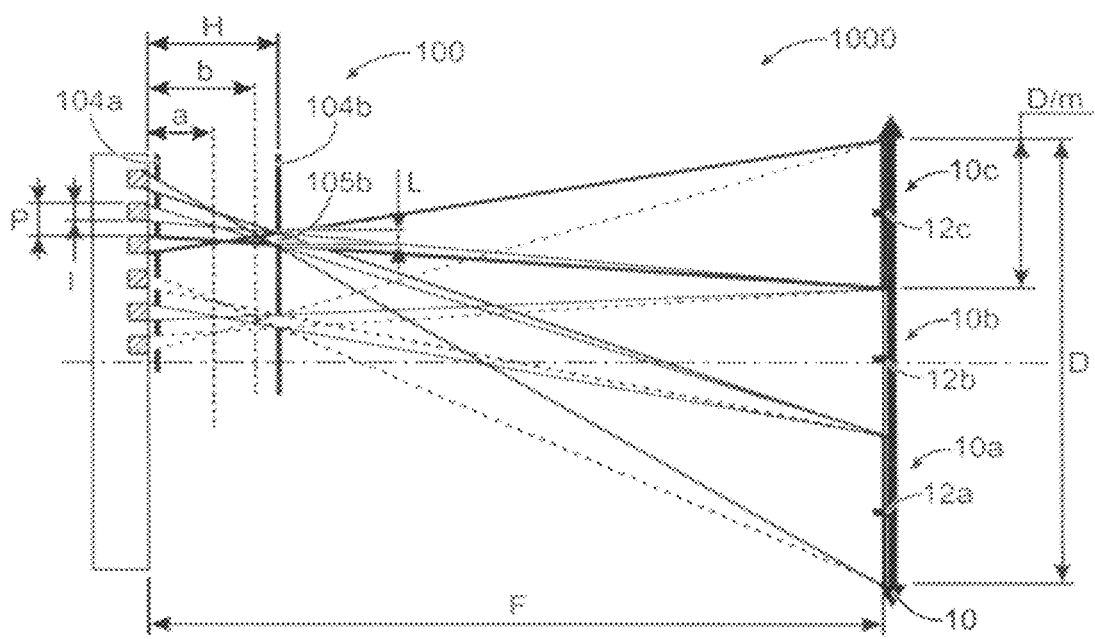
FIG. 9 represents the dimensions of elements of an image capture device including an imager integrated circuit.

It can be seen in FIG. 9 that the values of a and b are the same for all the pixels 102. The values of the angles of rays intersecting at the points a and b being low (lower than about 25°), the Descartes law for refraction can be approximated by the relationship:

incidence angle=$n$*refraction angle

Moreover, since each width L and the group of N associated pixels have very small dimensions in comparison with the dimension of the whole device 1000, it is possible to assume that all the rays passing through an aperture have only a very small angular deviation between each other, and they are thus, as a first approximation, refracted by the same value. Thereby, there is, to simplify: O=F/D (called "aperture of the optic") and Px=((N−1)p+1).

O is generally between 2 and 3 and has a fixed value.

The H and L values are searched for with a and b being unknown. The other variables are parameters of the optical structure.

The relationships of the triangles formed by the light rays give:

$$(F-b)/D=b/((N-1)\cdot p+l)=b/px$$

$$(H-b)/L=b/px$$

$$(F-a)/(D/m)=a/l$$

$$(H-a)/L=a/l$$

First, a and b are determined:

$$b=O\cdot D\cdot px/(D+px)$$

$$b=H\cdot px/(px+L)$$

$$a=m\cdot D\cdot O\cdot l/(m\cdot l+D)$$

$$a=l\cdot H/(L+l)$$

Therefore, it is obtained:

$$O\cdot D/(D+px)=H/(px+L)$$

$$m\cdot D\cdot O/(D+m\cdot l)=H/(L+l)$$

Calculation of L:

$$(L+px)/(D+px)=m\cdot (L+l)/(D+m\cdot l)$$

$$(L+px)\cdot (D+m\cdot l)=m\cdot (L+l)\cdot (D+px)$$

$$L \cdot (D+m \cdot l-m \cdot D-m \cdot px)=(m \cdot l \cdot D+m \cdot l \cdot px-D \cdot px-m \cdot l \cdot px)$$

$$L=(m \cdot 1-px)/((1-m)-m/D \cdot (l-px))$$

By reexpressing px, it is obtained:

$$L=(l \cdot (m-1)-(N-1) \cdot p)/((1-m)-(m/D) \cdot (N-1) \cdot p)$$

In the particular case where p=2·l and m=N, there is:

$$L=(N-1) \cdot p/(-(N-1)(N \cdot p+D)/D)$$

if D>>p, then L=p

Thus, it can be seen that the width L of the apertures 105b is little influenced by the optical system.

Calculation of H:

$$H=m \cdot D \cdot O \cdot (L+l)/(m \cdot l+D)$$

$$H=m \cdot D \cdot O/(m \cdot l+D) \cdot ((l \cdot (m-1)-(N-1) \cdot p)+l \cdot ((1-m)-(m/D) \cdot (N-1) \cdot p))/((1-m)-(m/D) \cdot (N-1) \cdot p)$$

$$H=m \cdot D \cdot O/(m \cdot l+D) \cdot (-(N-1) \cdot p-l \cdot (m/D) \cdot (N-1) \cdot p)/((1-m)-(m/D) \cdot (N-1) \cdot p)$$

$$H=m \cdot D \cdot O/(m \cdot l+D) \cdot (-(N-1) \cdot p \cdot (1-l \cdot m/D))/((1-m)-(m/D) \cdot (N-1) \cdot p)$$

$$H=m \cdot O \cdot (N-1) \cdot p/((m-1)+(m/D) \cdot (N-1) \cdot p)$$

(In the case of a material having an index n≠1 between the layers 104a, 104b, the H value is multiplied by n)

Thus, in the case of FIG. 9: m=N=3, there is then H=6·O·p/(2+6·p/D)

If D>>p then H=3·O·p·

In the particular case where m=N, there is:

$$H=N \cdot O \cdot p/(1+m \cdot p/D)$$

If D>>p, then H=N·O·p

Thus, it can be seen that the height H is dependent on the aperture F/D of the optical system.

The height H can have a value between about 10 µm and 100 µm, and for example equal to about 20 µm.

Given herein below are two numerical examples:

If O=2; p=3 µm; n=1.48; N=2

There is then H=17.76 µm.

If O=3; p=5 µm; n=1.66; N=3

There is then H=74.7 µm.

Under these conditions, the width of each slotted (or squared) diaphragm 150b in the upper masks 104b is very close to the pitch of the pixels p. Its arrangement (curvature of the slots for example) also depends on the index n of the material filling the space.

Figure 10A:
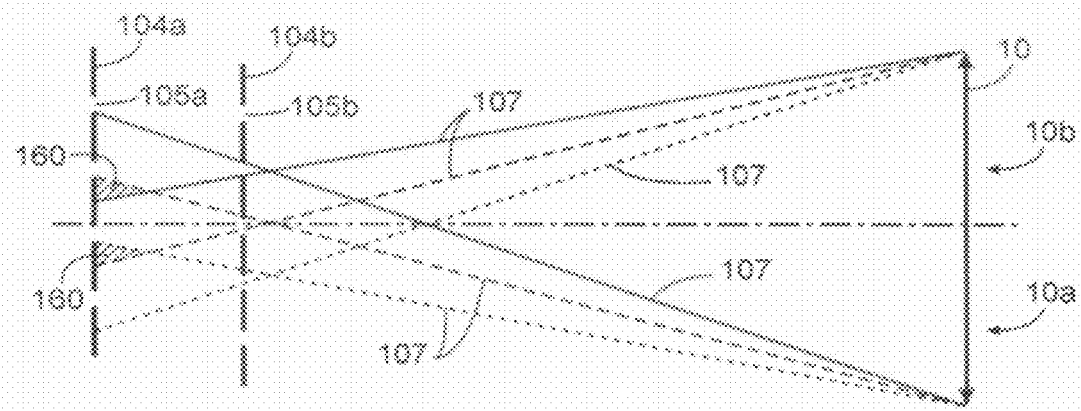
FIGS. 10A and 10B illustrate construction rules which are met upon designing an image capture device including an imager integrated circuit.
Figure 10B:
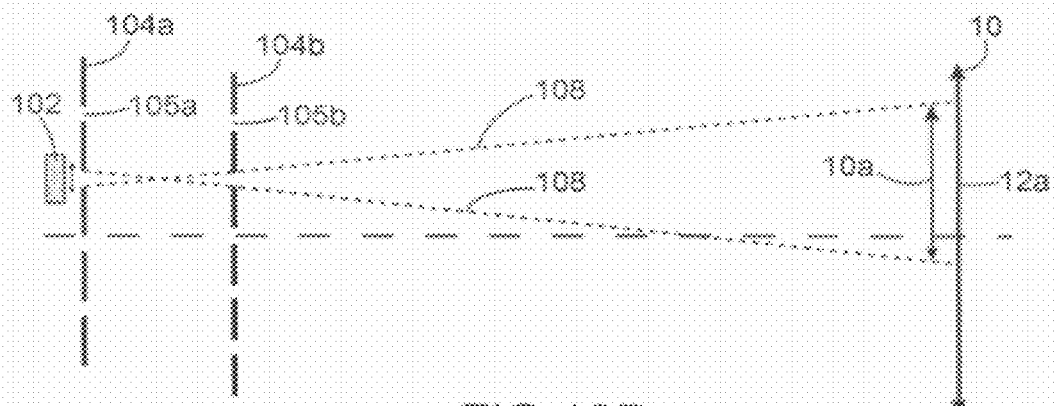

These equations come from construction rules of the imager integrated circuit which are met when designing the same:

as represented in FIG. 10A, the lines 107 representing the limits of the rays that can pass through the apertures 105b of the upper mask 104b, coming from the optical system 10 and intersecting between the layers 104a and 104b forming the diaphragms, form cones. The intersections of these cones form areas 160. The layers 104a, 104b and the apertures 105a, 105b therefore are made such that the intersections of these areas 160 with the layer 104b occur at the opaque parts of the layer 104a and not at the apertures 105a;

FIG. 10B illustrates that the sets of light rays, bounded in FIG. 10B by lines 108, from a portion 10a of the optical system 10 seen by a pixel 102 form cones. The alignment on an aperture 105a and an aperture 105b forming a lower diaphragm and an upper diaphragm respectively towards a pixel 102 defines an average point of view 12a of the pixel 102. Furthermore, the widths of the apertures 105a, 105b define the portion 10a of the optical system 10 which is seen by the pixel 102.

Figure 11:
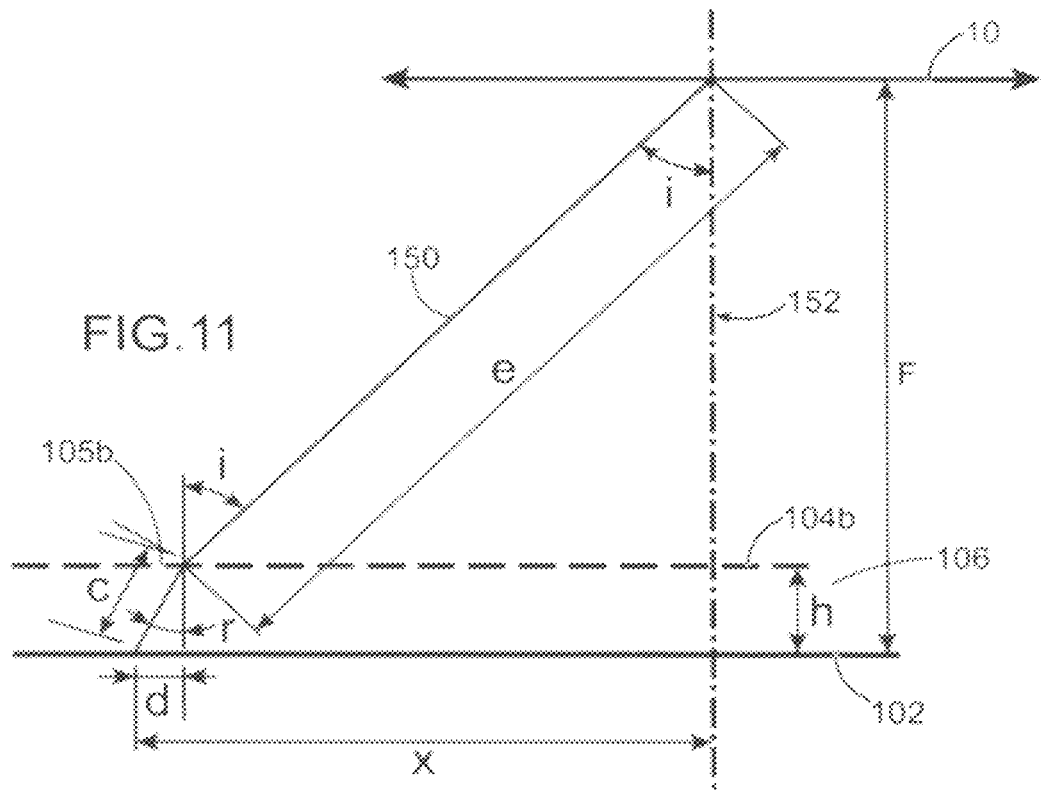
FIG. 11 represents the refraction undergone by a light ray in an image capture device comprising an imager integrated circuit.

FIG. 11 is referred to describe the refraction undergone by a light ray 150 from the optical system 10 to the pixels 102. It is attempted to determine the offset d between an aperture 105b towards a pixel 102 induced by the refraction due to the index n of the transparent material 106. The material 106 can be preferably selected such that its refracting index n be as close as possible to 1, and is for example silica, porous silica, a polymer, etc. n being generally between about 1 and 1.7.

Let i be the angle formed by the light ray 150 and the optical axis 152 of the optical system 10 between the optical system 10 and the plane of the upper diaphragms 104b, and r the angle formed between the light ray 150 and the optical axis 152 of the optical system 10 in the material 106.

According to the Descartes law, there is:

$$\sin(i)=n \cdot \sin(r)$$

But, sin(i)=(x−d)/e and sin(r)=d/c with e corresponding to the length of the light ray 150 between the optical system 10 and the plane of the upper diaphragms 104b, and c corresponding to the length of the light ray 150 in the dielectric material 106.

Besides, $c^2=d^2+h^2$ et $b^2=(x-d)^2+(F-h)^2$

Therefore, (x−d)·c=n·d·b can be calculated

That is $(x-d)^2 \cdot (d^2+h^2)=n^2 \cdot d^2 \cdot ((x-d^2)^2+(F-h)^2)$

In this equation, the variable d is the single unknown. A d polynomial equation will thus be developed which will give the solutions:

$$d^4 \cdot (1-n^2)-2d^3 \cdot x \cdot (1-n^2)+d^2 \cdot (x^2 \cdot (1-n^2 \cdot (F-h)^{2})-2d \cdot x \cdot h^2+h^2 \cdot x^2=0$$

Or even:

$$d^4-2d^3 \cdot x+d^2 \cdot (x^2+h^2-n^2 \cdot F \cdot (F-2h)/(1-n^2))-2d \cdot x \cdot h^2/(1-n^2)+h^2 \cdot x^2/(1-n^2)=0$$

The d values, being the solutions of this polynomial, are then retrieved by known numerical methods.

In the case where n is substantially equal to 1, this equation is simplified and does give the displacement d=h·x/F.

For a given index n, the position of the apertures is thus dependent on the focal length F of the optical system.

In the previously described exemplary embodiments, the dimensions of the apertures made in a same opaque layer (and in particular the apertures 105a forming the lower diaphragms) have substantially similar dimensions. However, generally, the dimensions of the apertures made in a same opaque layer can be different from each other. In this case, the different photodetectors will not provide identical electric signals for a same incident light excitation.

Figure 12:
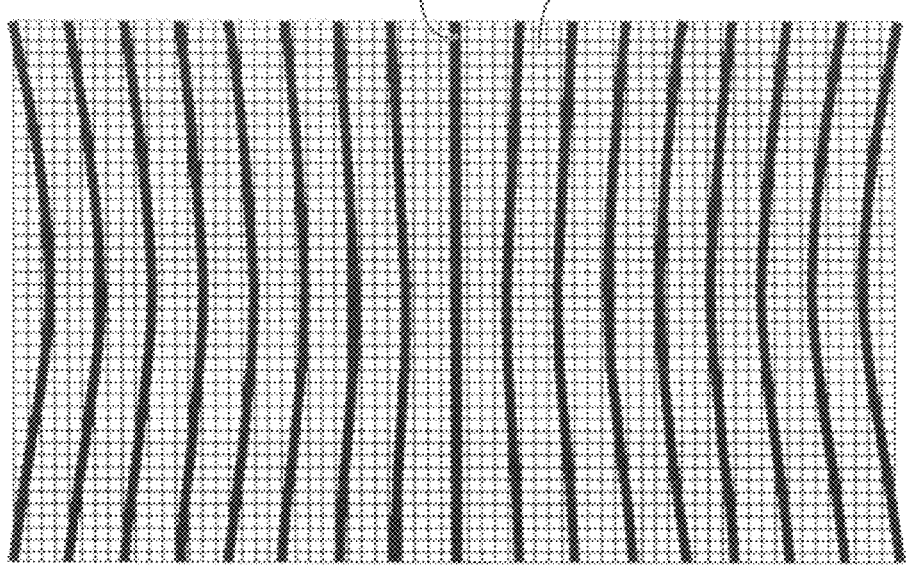
FIG. 12 represents an exemplary pattern formed by holes provided in an opaque layer of an imager integrated circuit.

FIG. 12 schematically represents a top view of an exemplary embodiment of apertures 105 intended to form the upper diaphragms of an imager integrated circuit according to the invention in the case where the index n is higher than 1.

The apertures 105b formed in the mask are represented by lines arranged above a grid representing the pixels 102. The curvature of the apertures 105b results from the offset d towards the alignment of the pixels. In the example represented in FIG. 11, the apertures 105b form trenches which are aligned side by side. In one alternative, the apertures 105 may be not aligned but distributed in a staggered row at each line of pixels, but still having the same curvature of FIG. 11, in the two directions of the plane.

When the means enabling the light rays to be selected are not made by colour filters or existing electric interconnection layers, and include dedicated opaque layers, these layers are made during or following the construction of the elements of the imager integrated circuit. Making them does not have any particular feature with respect to the steps implemented for making a conventional imager integrated circuit: deposition of uniform layers, etching of these layers through photolithography, etc.

The opaque layers can be made from metal. In an advantageous embodiment, each opaque layer can be formed by a layer of opaque material provided between one or more layers of antireflection material, for example composed of metal or metal oxide. For example, when the opaque layers are composed of aluminium, the antireflection layers can be composed of titanium or $TiO_2$ or any other material such that its refractive index n corresponds to the square root of (n of the metal*n of the medium around the metal).

The thickness of each opaque layer can be substantially equal to the quarter of the average working wavelength of the image capture device.

The invention claimed is:

1. An imager integrated circuit intended to cooperate with an optical system configured to direct light rays from a scene to an inlet face of the imager integrated circuit, said imager integrated circuit being configured to perform a simultaneous stereoscopic capture of N images corresponding to N distinct views of the scene, N being an integer higher than 1, each of the N images corresponding to light rays directed by a portion of the optical system which is different from those directing the light rays corresponding to the N−1 other images, the imager integrated circuit including:
   N subsets of pixels made on a same substrate, each of the N subsets of pixels being intended to perform the capture of one of the N images associated therewith,
   means interposed between each of the N subsets of pixels and the inlet face of the imager integrated circuit, and configured to pass the light rays corresponding to the image associated with said subset of pixels and block the other light rays directed from the optical system to said subset of pixels,
   and wherein said means include:
   at least two opaque layers superimposed one above the other with a space therebetween, provided between the pixels and the inlet face of the imager integrated circuit, both opaque layers having, passing therethrough, a plurality of holes forming, towards each pixel, at least one pair of superimposed diaphragms, formed by the alignment of the holes in one of the at least two opaque layers being different than the alignment of the holes in another of the at least two opaque layers, configured to pass a part of the light rays corresponding to the image associated with the subset of pixels of which said pixel is part and configured to block other light rays directed from the optical system to said pixel and corresponding to the other images, and
   wherein the optical system is facing the two opaque layers, wherein means is configured to
   pass light rays to at least one first subset of pixels from a portion of a right half of the optical system,
   pass light rays to at least one second subset of pixels from a portion of a left half of the optical system,
   block light rays to the at least one first subset of pixels from the portion of the left half of the optical system,
   block light rays to the at least one second subset of pixels from the portion of the right half of the optical system, and
   pass light rays from a middle point of the optical system to the first and second subsets of pixels,
   wherein between the opaque layers and the subsets of pixels, light rays that are not blocked by the opaque layers pass only through a dielectric layer disposed between the opaque layers and the subsets of pixels.

2. The imager integrated circuit according to claim 1, wherein the number of holes passing through each of both opaque layers is equal to the total number of pixels of the N subsets of pixels.

3. The imager integrated circuit according to claim 1, wherein, when N equals two and said portion of the optical system corresponds to one half of the optical system, a distance H between the pixels and a second one of both opaque layers, a first of both opaque layers being provided between the pixels and the second one of both opaque layers, is $H \leq 1.5 \times p \cdot O \cdot n$ with:
   p: pitch of the pixels;
   O: numerical aperture of the optical system;
   n: optical index of a transparent material provided between both opaque layers.

4. The imager integrated circuit according to claim 1, wherein the number of holes passing through a first one of both opaque layers is equal to the total number of pixels of the N subsets of pixels, and the number of holes passing through a second one of both opaque layers is equal to $(M_{pix}/N) \pm 1$, with $M_{pix}$ corresponding to said total number of pixels, said first one of both opaque layers being provided between the pixels and the second one of both opaque layers.

5. The imager integrated circuit according to claim 4, wherein the distance H between the pixels and the second one of both opaque layers is $$H = \frac{n \cdot m \cdot O \cdot (N-1) \cdot p}{(m-1) + (m/D) \cdot (N-1) \cdot p},$$

with:
   D: diameter of the optical system;
   D/m: diameter of one of said portions of the optical system;
   p: pitch of the pixels;
   O: numerical aperture of the optical system;
   n: optical index of a transparent material provided between both opaque layers.

6. The imager integrated circuit according to claim 1, wherein at least one of the opaque layers is formed by electric interconnection lines electrically connected to the pixels.

7. The imager integrated circuit according to claim 1, wherein the pixels are provided between the inlet face of the imager integrated circuit and electric interconnection lines electrically connected to the pixels.

8. The imager integrated circuit according to claim 1, wherein holes formed in the opaque layers form side by side aligned trenches or wherein the holes are provided in staggered rows.

9. The imager integrated circuit according to claim 1, wherein each pixel includes non-photosensitive electric or electronic elements masked by the opaque layers.

10. The imager integrated circuit according to claim 1, wherein both opaque layers are spaced apart from each other by at least one of the following elements: air, $SiO_2$, porous $SiO_2$, a resin optically transparent to light rays intended to be captured by the pixels.

11. The imager integrated circuit according to claim 1, wherein both opaque layers are composed of metal, or resin or metal and resin.

12. The imager integrated circuit according to claim 1, wherein both opaque layers are covered with at least one antireflection layer.

13. The imager integrated circuit according to claim 1, wherein the pixels are configured to capture images in the visible region, or in the infrared region, or in both visible and infrared regions.

14. A stereoscopic image capture device including at least one imager integrated circuit according to claim 1 and at least one optical system configured to direct light rays from a scene to the imager integrated circuit.

15. The image capture device according to claim 14, wherein the pixels of the imager integrated circuit are configured to capture images in the infrared region, said device being a bolometer.

16. An imager integrated circuit intended to cooperate with an optical system configured to direct light rays from a scene to an inlet face of the imager integrated circuit, said imager integrated circuit being configured to perform a simultaneous stereoscopic capture of N images corresponding to N distinct views of the scene, N being an integer higher than 1, each of the N images corresponding to light rays directed by a portion of the optical system which is different from those directing the light rays corresponding to the N−1 other images, the imager integrated circuit including:

N subsets of pixels made on a same substrate, each of the N subsets of pixels being intended to perform the capture of one of the N images associated therewith, means interposed between each of the N subsets of pixels and the inlet face of the imager integrated circuit, and configured to pass the light rays corresponding to the image associated with said subset of pixels and block the other light rays directed from the optical system to said subset of pixels, and wherein said means include:

at least two opaque layers superimposed one above the other with a space therebetween, provided between the pixels and the inlet face of the imager integrated circuit, both opaque layers having, passing therethrough, a plurality of holes forming, towards each pixel, at least one pair of superimposed diaphragms, formed by the alignment of the holes in one of the at least two opaque layers being different than the alignment of the holes in another of the at least two opaque layers, configured to pass a part of the light rays corresponding to the image associated with the subset of pixels of which said pixel is part and configured to block other light rays directed from the optical system to said pixel and corresponding to the other images, wherein, when N equals two and said portion of the optical system corresponds to one half of the optical system, a distance H between the pixels and a second one of both opaque layers, a first of both opaque layers being provided between the pixels and the second one of both opaque layers, is H≤1.5×p·O·n, with:

p: pitch of the pixels;
O: numerical aperture of the optical system;
n: optical index of a transparent material provided between both opaque layers.

17. An imager integrated circuit intended to cooperate with an optical system configured to direct light rays from a scene to an inlet face of the imager integrated circuit, said imager integrated circuit being configured to perform a simultaneous stereoscopic capture of N images corresponding to N distinct views of the scene, N being an integer higher than 1, each of the N images corresponding to light rays directed by a portion of the optical system which is different from those directing the light rays corresponding to the N−1 other images, the imager integrated circuit including:

N subsets of pixels made on a same substrate, each of the N subsets of pixels being intended to perform the capture of one of the N images associated therewith, means interposed between each of the N subsets of pixels and the inlet face of the imager integrated circuit, and configured to pass the light rays corresponding to the image associated with said subset of pixels and block the other light rays directed from the optical system to said subset of pixels, and wherein said means include:

at least two opaque layers superimposed one above the other with a space therebetween, provided between the pixels and the inlet face of the imager integrated circuit, both opaque layers having, passing therethrough, a plurality of holes forming, towards each pixel, at least one pair of superimposed diaphragms, formed by the alignment of the holes in one of the at least two opaque layers being different than the alignment of the holes in another of the at least two opaque layers, configured to pass a part of the light rays corresponding to the image associated with the subset of pixels of which said pixel is part and configured to block other light rays directed from the optical system to said pixel and corresponding to the other images, wherein the number of holes passing through a first one of both opaque layers is equal to the total number of pixels of the N subsets of pixels, and the number of holes passing through a second one of both opaque layers is equal to $(M_{pix}/N)\pm 1$, with $M_{pix}$ corresponding to said total number of pixels, said first one of both opaque layers being provided between the pixels and the second one of both opaque layers, wherein the distance H between the pixels and the second one of both opaque layers is $$H = \frac{n \cdot m \cdot O \cdot (N-1) \cdot p}{(m-1) + (m/D) \cdot (N-1) \cdot p},$$

with:
D: diameter of the optical system;
D/m: diameter of one of said portions of the optical system;
p: pitch of the pixels;
O: numerical aperture of the optical system;
n: optical index of a transparent material provided between both opaque layers.

* * * * *